United States Patent
Wyatt et al.

(10) Patent No.: US 8,665,595 B2
(45) Date of Patent: *Mar. 4, 2014

(54) METHOD AND APPARATUS FOR COOLING A CIRCUIT COMPONENT

(75) Inventors: William Gerald Wyatt, Plano, TX (US); Gary J. Schwartz, Dallas, TX (US)

(73) Assignee: OL Security Limited Liability Company, Dover, DE (US)

( * ) Notice: Subject to any disclaimer, the term of this patent is extended or adjusted under 35 U.S.C. 154(b) by 1306 days.

This patent is subject to a terminal disclaimer.

(21) Appl. No.: 11/383,647

(22) Filed: May 16, 2006

(65) Prior Publication Data
US 2006/0198105 A1 Sep. 7, 2006

Related U.S. Application Data

(63) Continuation of application No. 10/164,523, filed on Jun. 6, 2002, now Pat. No. 7,046,515.

(51) Int. Cl.
*H05K 7/20* (2006.01)

(52) U.S. Cl.
USPC ........... 361/695; 361/690; 361/694; 361/697; 361/704

(58) Field of Classification Search
USPC ......... 361/690, 695, 697, 719; 165/80.3, 185; 257/722
See application file for complete search history.

(56) References Cited

U.S. PATENT DOCUMENTS

| | | | |
|---|---|---|---|
| 4,682,651 A | 7/1987 | Gabuzda | 361/697 |
| 4,715,438 A | 12/1987 | Gabuzda | 165/185 |
| 4,753,290 A | 6/1988 | Gabuzda | 165/185 |
| 5,005,640 A | 4/1991 | Lapinski et al. | 165/170 |
| 5,358,032 A * | 10/1994 | Arai et al. | 165/80.3 |
| 5,365,400 A | 11/1994 | Ashiwake et al. | 361/699 |
| 5,409,352 A * | 4/1995 | Lin | 415/177 |
| 5,494,098 A | 2/1996 | Morosas | 165/121 |
| 5,504,650 A | 4/1996 | Katsui et al. | 361/697 |
| 5,581,443 A | 12/1996 | Nakamura et al. | 361/705 |
| 5,582,240 A | 12/1996 | Widmayer | 165/80.3 |
| 5,583,746 A | 12/1996 | Wang | 361/697 |

(Continued)

FOREIGN PATENT DOCUMENTS

| | | | | |
|---|---|---|---|---|
| EP | 0860 874 A2 | 12/1997 | | H01L 23/467 |
| JP | S60-90895 | 6/1985 | | H05K 7/20 |

(Continued)

OTHER PUBLICATIONS

International Search Report for PCT/US03/17952, filed Jun. 5, 2003, mailed Apr. 26, 2004.

(Continued)

*Primary Examiner* — Boris Chervinsky

(57) ABSTRACT

An apparatus includes a thermally conductive section with a side facing approximately parallel to an axis and adapted to be thermally coupled to a circuit component, and includes a fluid supply section which directs a fluid flow along the axis toward an opposite side of the thermally conductive section. The thermally conductive section splits the fluid flow into a plurality of flow portions which each flow through the thermally conductive section in a direction approximately parallel to a plane perpendicular to the axis, the flow portions exiting the thermally conductive section at a plurality of respective locations disposed along a substantial portion of the periphery of the thermally conductive section.

18 Claims, 6 Drawing Sheets

(56) References Cited

U.S. PATENT DOCUMENTS

| | | | |
|---|---|---|---|
| 5,694,294 A | 12/1997 | Ohashi et al. | 361/687 |
| 5,701,951 A * | 12/1997 | Jean | 165/121 |
| 5,731,952 A | 3/1998 | Ohgami et al. | 361/687 |
| 5,794,685 A | 8/1998 | Dean | 165/121 |
| 5,816,319 A | 10/1998 | Kamekawa et al. | 165/121 |
| 5,828,551 A | 10/1998 | Hoshino | 361/697 |
| 5,896,917 A | 4/1999 | Lemont et al. | 165/80.3 |
| 6,021,844 A | 2/2000 | Batchelder | 165/80.3 |
| 6,125,920 A | 10/2000 | Herbert | 165/80.3 |
| 6,135,200 A * | 10/2000 | Okochi et al. | 165/121 |
| 6,199,624 B1 * | 3/2001 | Wotring | 165/80.3 |
| 6,367,542 B1 * | 4/2002 | Chen | 165/80.3 |
| 6,373,700 B1 | 4/2002 | Wang | 361/709 |
| 6,407,919 B1 * | 6/2002 | Chou | 361/697 |
| 6,411,508 B1 | 6/2002 | Kang et al. | 361/695 |
| 6,418,020 B1 * | 7/2002 | Lin | 361/703 |
| 6,424,529 B2 * | 7/2002 | Eesley et al. | 361/703 |
| 6,487,077 B1 * | 11/2002 | Lin | 361/697 |
| 6,571,862 B1 * | 6/2003 | Wang et al. | 165/80.3 |
| 6,577,502 B1 | 6/2003 | DiStefano et al. | 361/686 |
| 6,578,625 B1 | 6/2003 | Wyatt et al. | 165/80.3 |
| 6,664,928 B2 * | 12/2003 | Ogawa et al. | 343/700 MS |
| D491,260 S * | 6/2004 | Luo | D23/411 |
| D511,326 S * | 11/2005 | Watanabe et al. | D13/179 |
| 6,972,950 B1 | 12/2005 | Wyatt et al. | 361/687 |
| 7,152,666 B2 * | 12/2006 | Chen et al. | 165/80.3 |

FOREIGN PATENT DOCUMENTS

| | | | | |
|---|---|---|---|---|
| JP | S62-122353 | 8/1987 | | H01L 23/26 |
| JP | H6-260571 | 9/1994 | | H01L 23/36 |
| JP | 2001-36271 | 2/2001 | | |

OTHER PUBLICATIONS

International Search Report for PCT/US03/17953, dated Jan. 19, 2005 provided via facsimile Jan. 19, 2005 (4 pgs.).
Correspondence regarding Application No. 2004-511965; Notification of Reasons for Rejection, ITOH International Patent Office, English Translation provided, Aug. 5, 2008.
Correspondence regarding Application No. 2004-511965; Notification of Reasons for Rejection, ITOH International Patent Office, English Translation provided, Apr. 21, 2009.
Correspondence regarding Application No. 03 757 402.7-2224, Reference No. JL4803; Communication Pursuant to Article 94(3) EPC received from EPO, dated Jul. 29, 2009.
Translation of Decision on Rejection for Patent Application No. 2004-511965; mailing date of Nov. 4, 2009 and reported on Dec. 10, 2009; 2 pages.
*Canadian Intellectual Property Office*; Office Action for Application No. 2,488,700; 4 pages, Oct. 19, 2010.
*European Patent Office; Communication Pursuant to Article* 94(3) EPC for Application No. 03 757 402.7-2224; 5 pages, May 20, 2011.

* cited by examiner

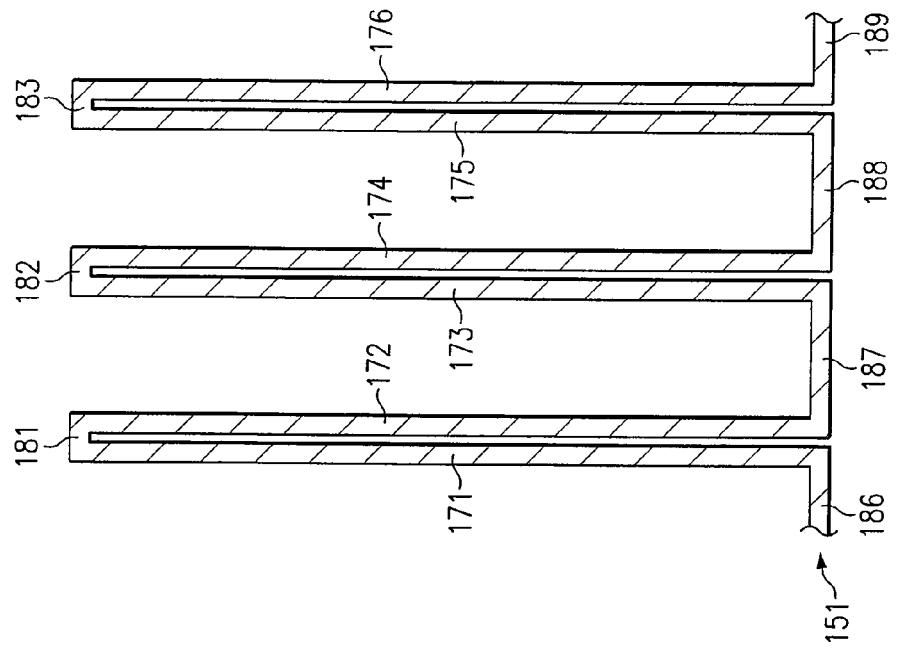
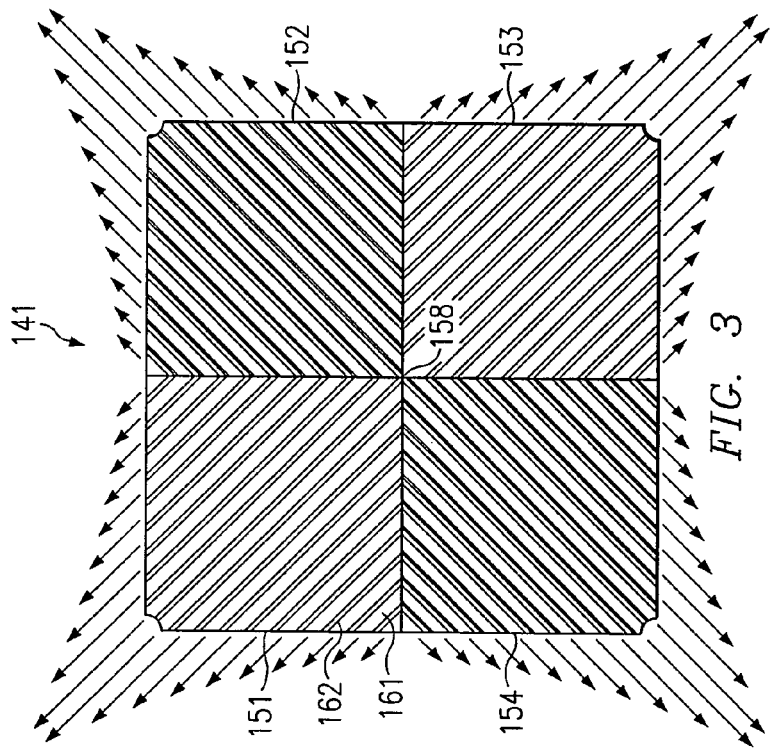

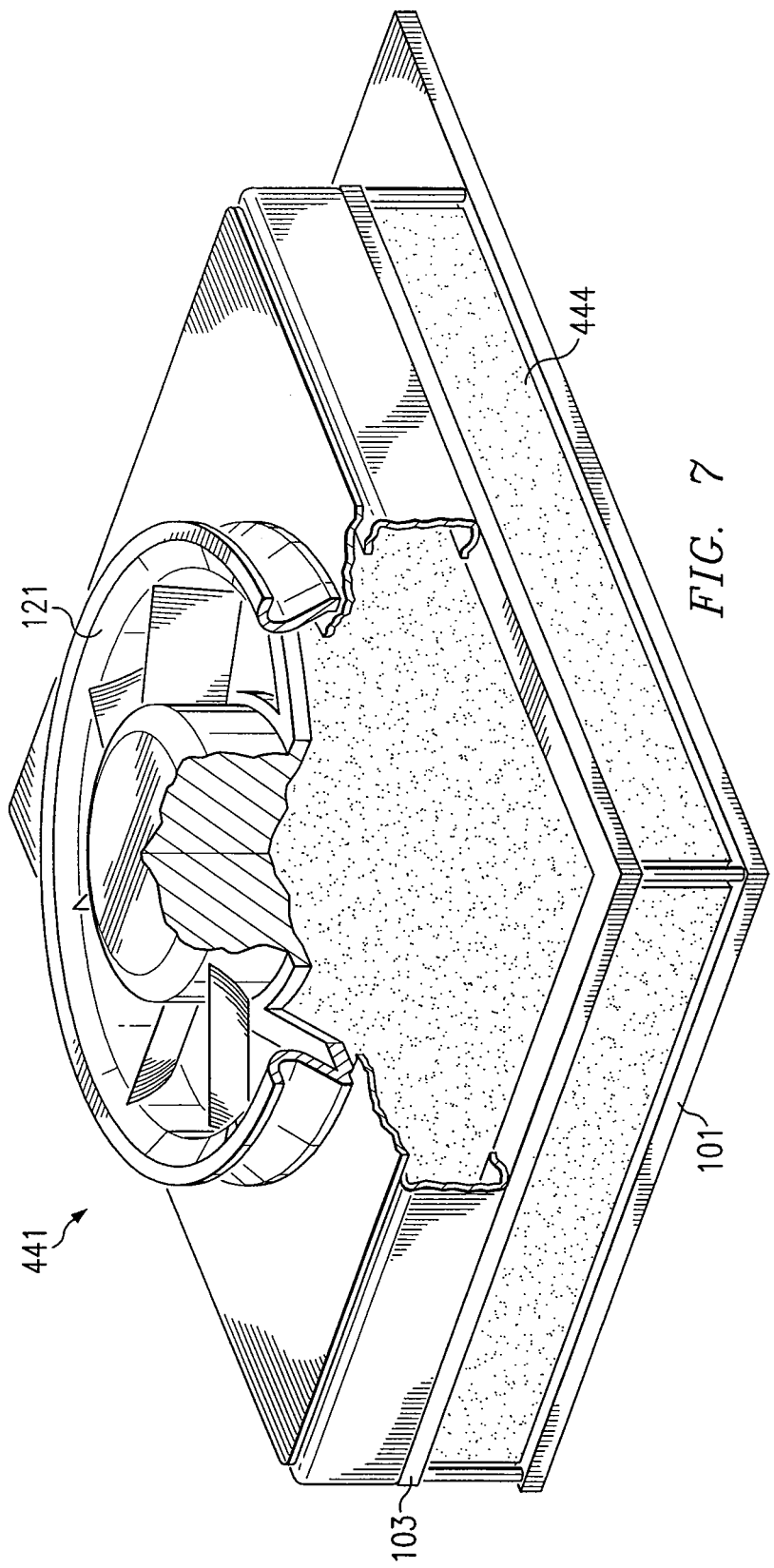

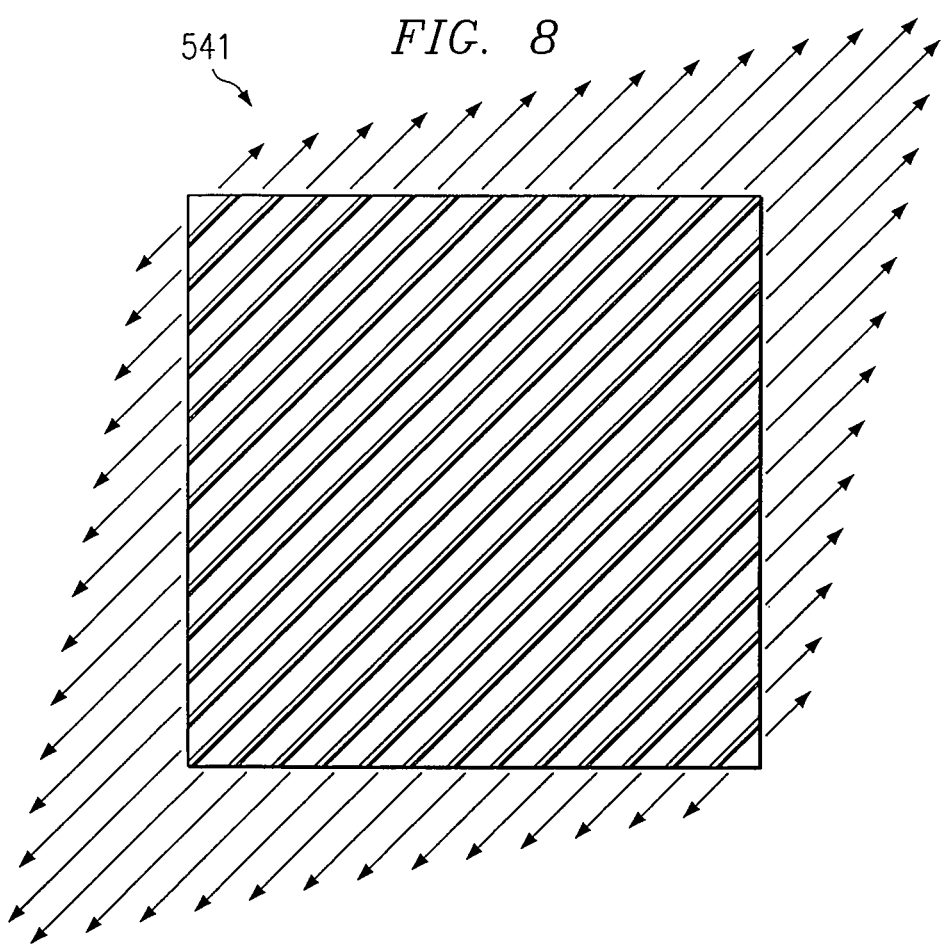

METHOD AND APPARATUS FOR COOLING A CIRCUIT COMPONENT

RELATED APPLICATIONS

This application is a continuation of U.S. application Ser. No. 10/164,523, filed Jun. 6, 2002, entitled "Method and Apparatus for Cooling a Circuit Component", now U.S. Pat. No. 7,046,515.

TECHNICAL FIELD OF THE INVENTION

This invention relates in general to cooling techniques and, more particularly, to techniques for cooling circuit devices.

BACKGROUND OF THE INVENTION

Over the past fifteen years, personal computers have enjoyed a progressively increasing popularity, including portable computers of the type commonly known as "laptop" and "notebook" computers. During this same time period, significant advances have been made in the design of the processors used in personal computers, including portable computers. In this regard, the amount of circuitry which can be fabricated in a given area of an integrated circuit has increased significantly, thereby facilitating the implementation and fabrication of significantly more sophisticated processor designs. Further, the operational capabilities of processors have increased dramatically, and there have also been significant increases in the speed at which processors can operate.

A side effect of these technological advances is that state-of-the-art processors and other integrated circuits used in personal computers produce significantly more heat during normal operation than their predecessors did only a few years ago. In some systems, the processors and related components are operated at clock speeds significantly below their maximum rated clock speeds, in order to reduce the amount of heat generated, and thus avoid the need to provide active cooling. However, operating the processor at a speed less than its maximum rated speed decreases the capability of the system, and thus the value of the system in the eyes of consumers, which is undesirable. Therefore, and focusing specifically on processor chips, technology has reached a point where, in order to operate a processor at its maximum rated speed while effectively dissipating the heat which is generated, it is relatively standard for a desktop computer to have a forced-air cooling arrangement for the high-performance processor used in it. In particular, it is common to dedicate a relatively large heat sink and/or a powerful fan to the specific task of cooling the processor of a desktop computer. However, while these cooling arrangements have been generally satisfactory for use in desktop computers, they are not entirely satisfactory for use in portable computers.

More specifically, due in part to marketing efforts and consumer preferences, portable computers have evolved in design to a point where they are relatively thin and lightweight. In order to accommodate in a portable computer the type of cooling arrangement that has now become common in desktop computers, there would have to be an increase in both the thickness and weight of the portable computer. But a significant increase in the weight and/or thickness of a portable computer is undesirable from a commercial perspective, because it runs contrary to consumer preference for thin and lightweight units. Another significant marketing criteria for portable computers is the length of time that a fully-charged battery can run a portable computer before the battery becomes discharged. The powerful fans used in many desktop cooling arrangements would tend to consume a significant amount of battery power if used in a portable computer, and would thus undesirably shorten the effective battery life. Although a larger battery could be used, this would result in an increase in the size and/or weight of the portable computer, which as discussed above is undesirable.

The above-mentioned cooling arrangements for processors provide little or no benefit in regard to cooling of other circuit components that are separate from but associated with the processors. To date, it has typically not been necessary to provide components other than the processor with a direct cooling arrangement. However, advances in technology have increased the amount of heat generated by these other types of components, to the point where more effective cooling techniques are needed for these components.

Some prior attempts have been made to provide effective cooling in portable computers, but the results have not been entirely satisfactory. For example, heat pipes have been used to conduct heat from an interior component to an external finned heat sink, but the heat sink adds undesirable weight. Although the additional weight can be reduced to some extent by making the heat sink from a lightweight material such as magnesium, magnesium is relatively expensive, and the added expense is undesirable. As another example, some portable computers have vents provided in upper and/or lower portions of the housing, in order to facilitate cooling through natural convection currents. However, this approach provides only limited benefit, and technology is reaching a point where this type of natural convection cooling is simply inadequate to remove the amount of heat that is being generated.

SUMMARY OF THE INVENTION

From the foregoing, it may be appreciated that a need has arisen for a method and apparatus which facilitate efficient cooling of a circuit component. According to the present invention, a method and apparatus are provided to address this need, and involve: configuring a thermally conductive section to have a side which faces in direction approximately parallel to an axis and which is adapted to be thermally coupled to a circuit component, and directing a fluid flow along the axis approximately in the first direction, the thermally conductive section causing the fluid flow to split into a plurality of flow portions which each flow through the thermally conductive section in a direction approximately parallel to a plane perpendicular to the axis, the flow portions exiting the thermally conductive section at a plurality of respective locations disposed along a substantial portion of the periphery of the thermally conductive section.

BRIEF DESCRIPTION OF THE DRAWINGS

A better understanding of the present invention will be realized from the detailed description which follows, taken in conjunction with the accompanying drawings, in which:

FIG. 3 is a diagrammatic top view of a finstock which is part of the cooling assembly of FIG. 2;

FIG. 4 is a diagrammatic fragmentary sectional side view of the finstock of FIG. 3;

FIG. 7 is a diagrammatic fragmentary perspective view similar to FIG. 2, but showing a cooling assembly which is an alternative embodiment of the cooling assembly of FIG. 2; and FIG. 8 is a diagrammatic top view similar to FIG. 3, but showing a finstock which is still another alternative embodiment of the finstock shown in FIG. 3.

DETAILED DESCRIPTION OF THE INVENTION

Figure 1:
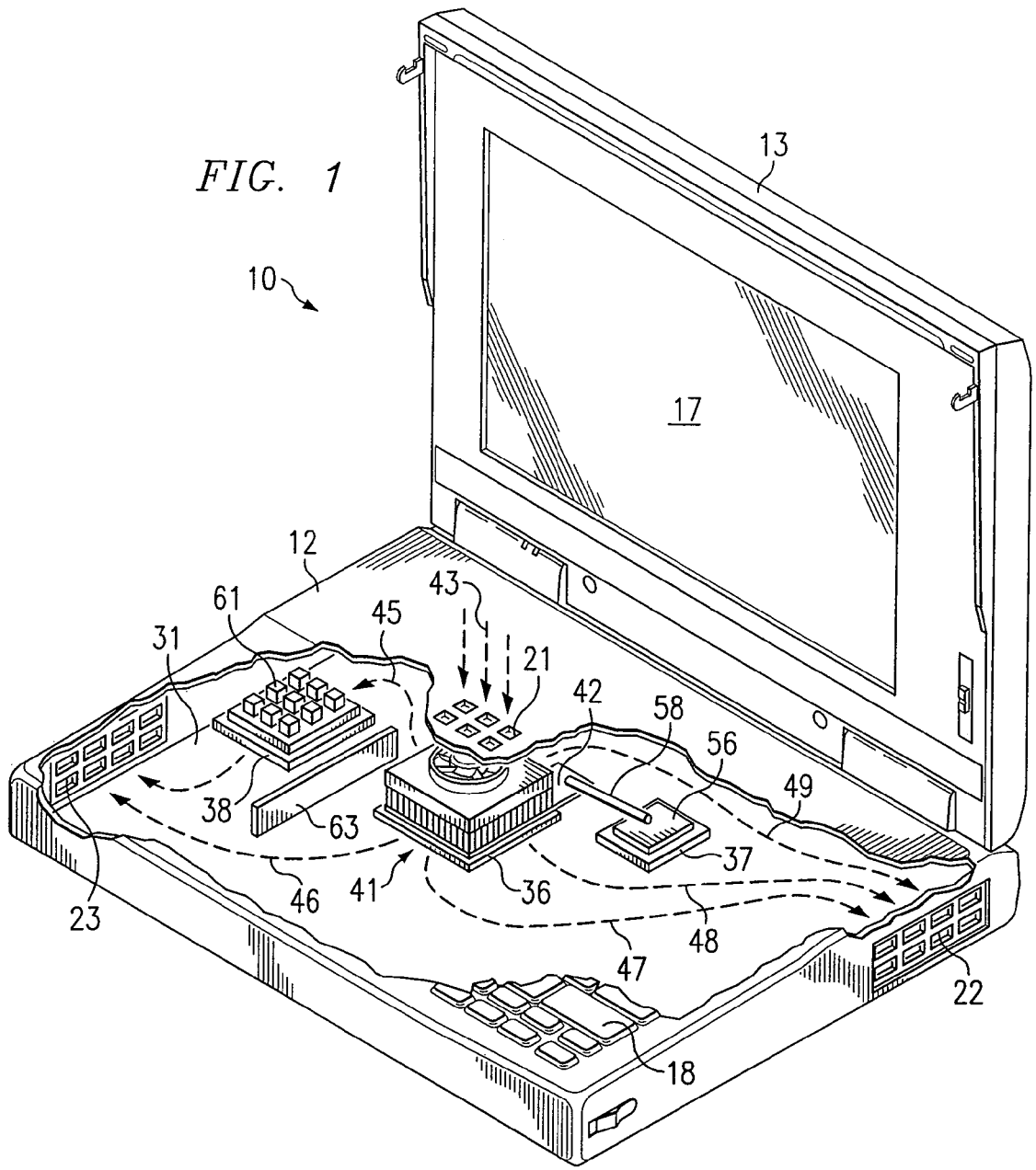
FIG. 1 is a diagrammatic fragmentary perspective view of a portable computer that embodies aspects of the present invention.

FIG. 1 is a diagrammatic fragmentary perspective view of an apparatus which is a portable computer 10, and which embodies aspects of the present invention. The computer 10 includes a housing 12 and a lid 13. The lid 13 is pivotally supported on the housing 12 for movement between an open position which is shown in FIG. 1, and a closed position in which the lid is adjacent the top surface of the housing 12. The lid 13 contains a liquid crystal display (LCD) panel 17 of a type commonly used in portable computers.

A plurality of manually operable keys 18 are provided on top of the housing 12, and collectively define a computer keyboard. In the disclosed embodiment, the keyboard conforms to an industry-standard configuration, but it could alternatively have some other configuration. The top wall of the housing 12 has, in a central portion thereof, a cluster of openings 21 which each extend through the top wall. The openings 21 collectively serve as an intake port. The housing 12 also has, at an end of the right sidewall which is nearest the lid 13, a cluster of openings 22 that collectively serve as a discharge port. Further, the left sidewall of the housing 12 has, near the end remote from the lid 13, a cluster of openings 23 that collectively serve as a further discharge port.

A circuit board 31 is provided within the housing 12. The circuit board 31 has a large number of components thereon, but for clarity these components are not all depicted in FIG. 1. In particular, FIG. 1 shows only three components 36, 37 and 38, each of which produces heat that must be dissipated. The integrated circuit 36 contains a high-performance processor, which in the disclosed embodiment is a known device that can be commercially obtained under the trademark PENTIUM from Intel Corporation of Santa Clara, Calif. However, the present invention is compatible with a wide variety of integrated circuits, including those containing other types of processors.

A cooling assembly 41 is mounted on top of the integrated circuit 36, in thermal communication therewith. The cooling assembly 41 may be mounted on the integrated circuit 36 using a thermally conductive epoxy, or in any other suitable manner that facilitates a flow of heat between the integrated circuit 36 and the cooling assembly 41. The internal structure of the cooling assembly 41 is described in more detail later. The cooling assembly 41 has an outwardly projecting tab 42 which is thermally conductive, for a purpose discussed later.

The cooling assembly 41 draws air into the housing 12 through the intake port defined by the openings 21, as indicated diagrammatically at 43. This air flow passes through the cooling assembly 41, and heat from the cooling assembly 41 is transferred to this air flow. Respective portions of this air flow exit from the cooling assembly 41 in a variety of different horizontal directions, and then travel to and through the discharge port defined by the openings 22 or the discharge port defined by the openings 23. The air flow travels from the cooling assembly 41 to the discharge ports along a number of different flow paths. Some examples of these various flow paths are indicated diagrammatically in FIG. 1 by broken lines 45-49. As air flows from the cooling assembly 41 to the openings 22 and 23 that define the two discharge ports, the air travels over and picks up heat from components other than the processor, including the components 37 and 38, as well as other components that are not specifically shown in FIG. 1.

The pattern of air flow from the cooling assembly 41 to the discharge ports depends on the number of discharge ports, and on where the discharge ports are located. Further, when there are two or more discharge ports, the relative sizes of the discharge ports will affect the pattern of air flow, where the size of each port is the collective size of all of the openings defining that port. For example, if the collective size of the openings in one of the discharge ports exceeds the collective size of the openings in the other discharge port, more air will flow to and through the former than the latter. With this in mind, hot spots can be identified in the circuitry provided on the circuit board 31, and then the location and effective size of each discharge port can be selected so as to obtain an air flow pattern in which the amount of air flowing past each identified hot spot is more than would otherwise be the case.

The integrated circuit 37 has a thermally conductive metal plate 56 mounted to the top surface thereof, in a manner so that the plate 56 and the integrated circuit 37 are in thermal communication. In the embodiment of FIG. 1, the plate 56 is secured to the integrated circuit 37 using a thermally conductive epoxy, but this could alternatively be effected in some other suitable manner. A heat pipe 58 of a known type has one end soldered to the plate 56, and its other end soldered to the tab 42 of the cooling apparatus 41. Alternatively, the heat pipe 58 could be thermally coupled to the plate 56 and the tab 42 in some other suitable manner, for example through use of a thermally conductive epoxy, or by providing metal parts on the plate 56 and the tab 42 which can be crimped around the ends of the heat pipe 58. As still another alternative, in order to help keep the housing 12 thin, the cooling apparatus 41 could be mounted on the circuit board 31 at a location near the processor integrated circuit 36, a plate such as that shown at 56 could be provided on the processor integrated circuit 36, and the heat pipe 58 could extend from the plate on the processor integrated circuit to the cooling apparatus 41.

The integrated circuit 38 has a heat sink 61 mounted on the top surface thereof, in a manner so that the heat sink 61 and the integrated circuit 38 are in thermal communication. In the embodiment of FIG. 1, the heat sink 61 is secured to the integrated circuit 38 using a thermally conductive epoxy, but it could alternatively be secured in place in any other suitable manner. The heat sink 61 is made of a metal such as aluminum, or a metal alloy that is primarily aluminum, and has a base with an array of vertically upwardly extending projections. As air travels from the cooling assembly 41 along the path 45 to the discharge port defined by the openings 23, it flows over the heat sink 61 and through the projections thereof. Heat generated by the integrated circuit 38 passes to the heat sink 61, and then from the heat sink 61 to the air flowing along path 45. The heat sink 61 transfers heat from the integrated circuit 38 to the air flow 45 at a lower temperature than would be the case if the heat sink 61 was omitted and heat had to be transferred directly from the integrated circuit 38 to the air flow.

A wall or vane 63 is provided within the housing 12, and extends vertically between the circuit board 31 and the underside of the top wall of the housing 12. In the disclosed embodiment, the vane 63 is an integral part of the housing top wall, and projects downwardly from the top wall. However, the vane 63 could alternatively be a physically separate part, and could be mounted on the top wall, or on the circuit board 31. The vane 63 influences the pattern of air which flows from the cooling assembly 41 to the discharge port defined by the openings 23. After one or more hot spots on a given circuit board have been identified, one or more vanes of the type shown at 63 can be added, with each such vane having a size, orientation and location that help to increase the amount of air flowing past at least one of the hot spots.

Figure 2:
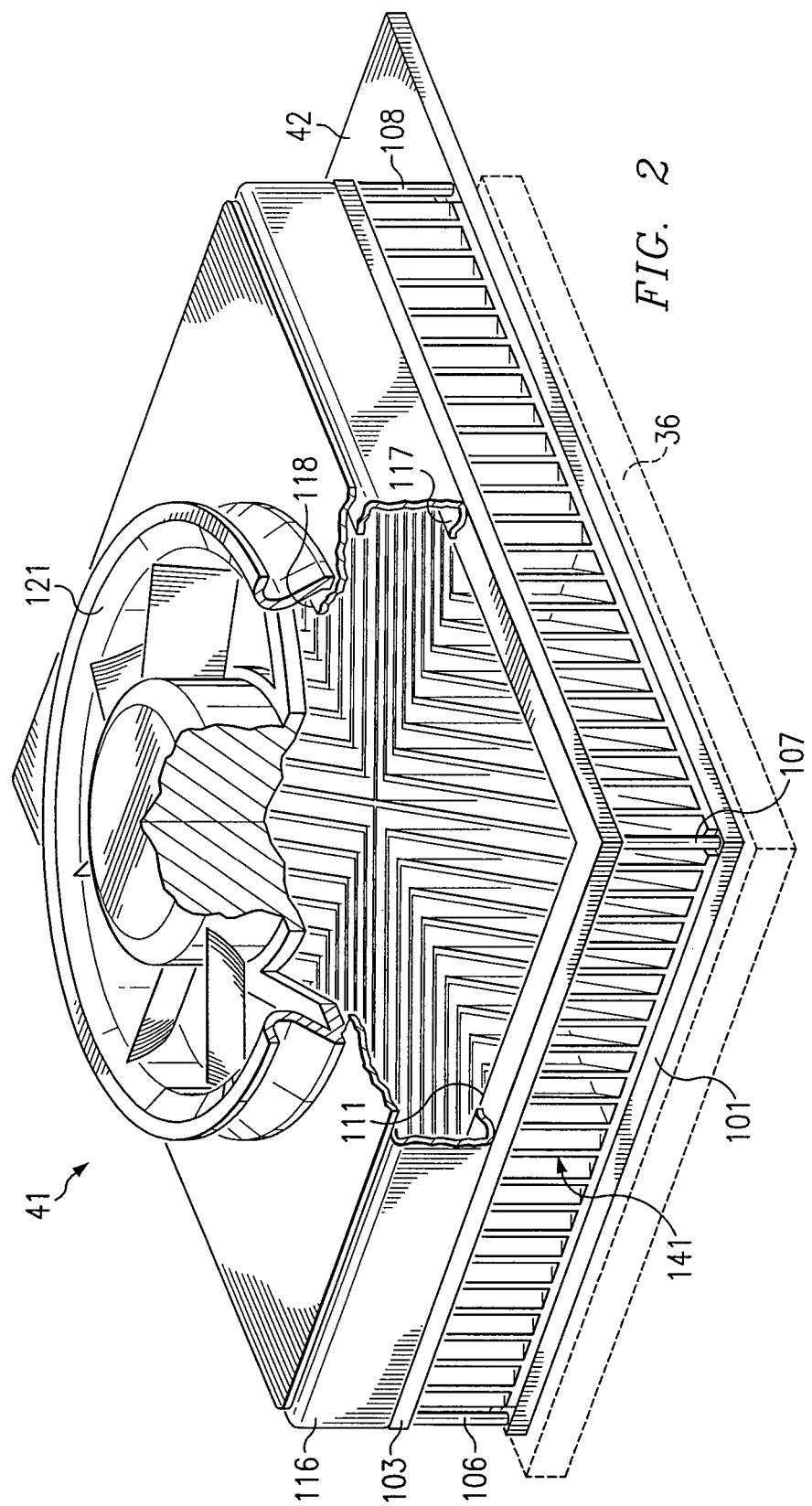
FIG. 2 is a diagrammatic fragmentary perspective view of a cooling assembly which is part of the portable computer of FIG. 1.

FIG. 2 is a diagrammatic fragmentary perspective view which shows the cooling assembly 41 in an enlarged scale, and which also shows in broken lines the integrated circuit 36 on which the cooling assembly 41 is mounted. The cooling assembly 41 includes a bottom plate 101 which is made of aluminum or an aluminum alloy, and which has approximately a square shape, except for an integral projection that extends outwardly on one side thereof to serve as the tab 42. A top plate 103 is made of aluminum or an aluminum alloy, and has a square shape which conforms in size to the bottom plate 101. The top plate 103 is supported a small distance above the bottom plate 101 by four vertical posts disposed at the respective corners of the plates 101 and 103, three of these posts being visible at 106-108 in FIG. 2. The posts are secured to the plates 101 and 103 by welding or brazing, or in any other suitable manner. The top plate 103 has a square opening 111 extending vertically through it. The opening 111 is only slightly smaller in size than the plate 103 itself, such that the top plate 103 is effectively a square frame.

An plenum 116 of small vertical height is made of aluminum or an aluminum alloy, and in a top view has a square shape which conforms in size to the square top plate 103. Alternatively, the plenum could be made of some other suitable material, such as a polycarbonate material. The plenum 116 is fixedly secured to the top plate 103, for example by welding or brazing, by a thermally conductive epoxy, by a thermally conductive double sided tape of a known type, or in any other suitable manner. The bottom wall of the plenum 116 has a square opening 117, which is aligned with and has the same size as the opening 111 provided through the top plate 103.

The top wall of the plenum 116 has a circular opening 118. A low-profile electric fan 121 has a relatively small vertical height, has a diameter somewhat greater than the diameter of the opening 118, and is fixedly secured to the top wall of the plenum 116 so as to be coaxially aligned with the circular opening 118. When electric current is supplied to the fan 121 through not-illustrated wires, the fan causes air to flow downwardly through the plenum 116.

The cooling assembly 41 includes, between the top and bottom plates 103 and 101, a thermally conductive finstock 141. The finstock 141 is fixedly mounted on the top surface of the bottom plate 101, so as to be in thermal communication therewith. In the disclosed embodiment, the finstock 141 is secured to the bottom plate 101 by a thermally conductive epoxy of a known type, but it could alternatively be secured to the bottom plate 101 in any other suitable manner, for example by welding or brazing. The finstock 141 is described in more detail with reference to FIGS. 3 and 4.

In this regard, FIG. 3 is a diagrammatic top view of the finstock 141, and FIG. 4 is a diagrammatic fragmentary sectional side view of a portion of the finstock 141. With reference to FIG. 3, the finstock 141 includes four separate parts 151-154, each of which is approximately square when viewed from the top, except that one outer corner of each has a small recess which provides clearance for a respective one of the four support posts, three of these posts being visible at 106-108 in FIG. 2. The opposite or inner corners of the parts 151-154 are all located at a common point disposed along a vertical axis 158, which extends perpendicular to the plane of FIG. 3. The fan 121 (FIG. 2) and the opening 118 in the plenum top wall are both concentric to the axis 158 (FIG. 3).

The parts 151-154 of the finstock 141 are all identical to each other, and therefore only the part 151 is described here in detail. With reference to FIG. 3, the part 151 includes an approximately horizontal base portion 161, and a plurality of parallel fins that each project vertically upwardly from the base portion 161. The part 151 is made from a thin sheet of an aluminum alloy, which in the disclosed embodiment is an alloy commonly known in the art as Aluminum 3003, and which typically includes 1.2% magnesium with the remainder made of aluminum, although the definition for this alloy allows for magnesium of 1% to 1.5%, silicon less than 0.6%, iron less than 0.7%, copper less than 0.2% and zinc less than 0.1%, and other elements less than 0.05%, where all element other than aluminum and magnesium total less than 0.15%.

The aluminum alloy sheet which serves as the part 151 is bent to have the cross-sectional shape shown in FIG. 4. However, the part 151 could alternatively be made of some other suitable material that conducts heat well. The bent aluminum sheet which defines the part 151 has a plurality of vertically extending portions that each serve as a sidewall, six of which are visible at 171-176. These sidewalls are arranged in pairs, where the sidewalls of each pair are closely adjacent one another, and are spaced from the sidewalls of other pairs. The bent aluminum sheet also includes a plurality of top wall portions that each extend between the upper ends of the sidewalls of a respective pair, three of the top wall portions being visible at 181-183. The aluminum sheet further includes a plurality of bottom wall portions that each extend between the lower ends of two sidewalls which are in different pairs, four of the bottom wall portions being visible at 186-189.

The bottom wall portions, including those shown at 186-189, collectively define the base 161 (FIG. 3) of the part 151. The sidewall pair 171-172 and the top wall portion 181 define a fin 162 (FIG. 3), the sidewall pair 173-174 and the top wall portion 182 define another fin 162, and the sidewall pair 175-176 and the top wall portion 183 define yet another fin 162. The sidewalls of each pair are disposed sufficiently closely to each other so that there is not enough room between them for any significant flow of air, and thus it is not necessary to form openings in the top wall portions in order to allow part of the air flow to enter the region between the sidewalls of each pair. The parts 151-154 can be fabricated by bending a large aluminum sheet so that it has the profile shown in FIG. 4, and then cutting the parts 151-154 from this large sheet with an abrasive water jet.

Referring again to FIG. 3, it will be noted that the parts 151-154 each have one fin which is located approximately in the center thereof, and which extends diagonally across that part in a direction substantially radially of the axis 158. Each of the other fins on each part 151-154 has an inner end which engages the inner end of a respective fin on an adjacent part 151-154. In the disclosed embodiment, the fins 162 of the finstock 141 have a thickness of approximately 0.006 inch, a vertical height of 0.25 inch, and a pitch of 18 fins per inch.

In operation, and with reference to FIG. 2, heat produced by the circuitry within the integrated circuit 36 propagates upwardly from the integrated circuit 36 to the bottom plate 101 of the cooling apparatus 41, and then from the bottom plate 101 into the parts 151-154 of the finstock 141. The fan 121 draws air into the housing 12 through the openings 22 that define the intake port, and forces this air to flow downwardly through the plenum 116 and the opening 111 in the top plate 103.

When this downward flow of air reaches the finstock 141, the fins of the four finstock parts 151-154 cause this air flow to split into portions that are redirected to flow in four different horizontal directions between adjacent fins, as indicated diagrammatically by the arrows provided around the finstock 141 in FIG. 3. The relative lengths of the arrows in FIG. 3 is a diagrammatic indication of the volume and velocity of air exiting the finstock 141 at each of a number of locations along the periphery thereof. By splitting the air flow into portions which are each redirected to flow in one of four different directions, the finstock 141 gives the cooling apparatus 41 a very low pressure drop, which facilitates a higher rate of air flow. The low pressure drop permits the fan 121 to drive the desired air flow with minimal effort, thereby minimizing the amount of battery power consumed by the fan, which is always advantageous in a portable computer. Further, the low pressure drop minimizes the audible noise of the air flow, and facilitates better cooling.

In this disclosed embodiment, the cooling assembly 41 can dissipate 20 watts of heat in a 2 inch×2 inch footprint, with a temperature rise of about 15° C. The overall thickness of the cooling assembly is less than about 0.4 inch. The power consumption of the fan is only about 2 to 3 watts, of which about 0.7 watt relates to cooling of the component 36 containing the processor, and the remainder relates to the additional pressure drop involved in controlling the air flow from the cooling assembly 41 to the openings 22 and 23 that define the discharge ports. The volume of air flow through the cooling assembly 41 is about 3.53 cubic feet per minute, and the pressure loss is 0.029 inches of water.

Figure 5:
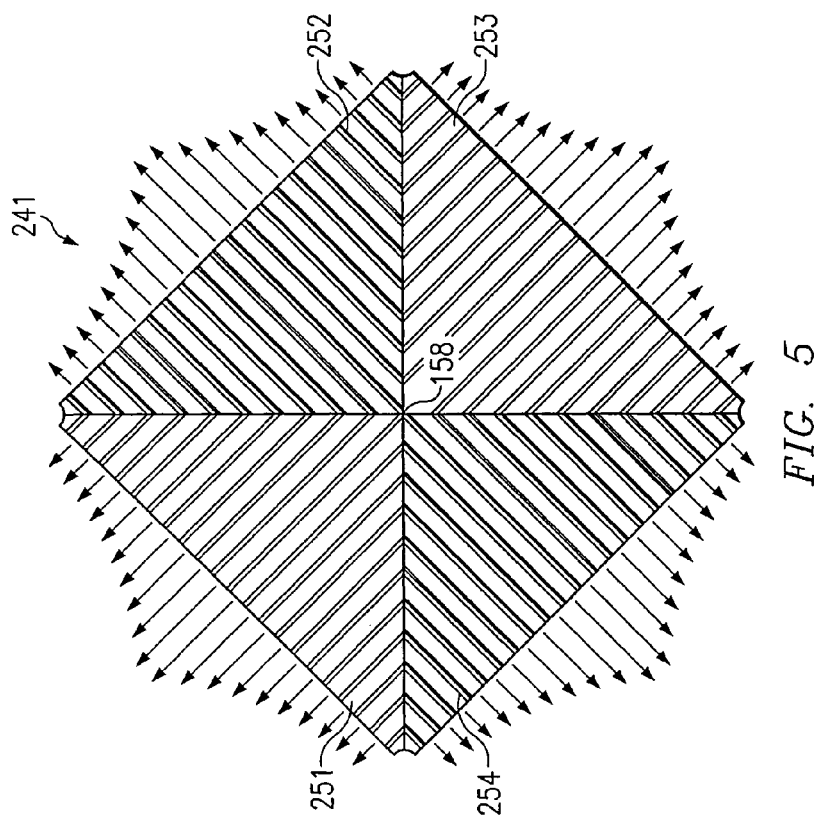
FIG. 5 is a diagrammatic top view similar to FIG. 3, but showing a finstock which is an alternative embodiment of the finstock shown in FIG. 3.

FIG. 5 is a diagrammatic top view similar to FIG. 3, but showing a finstock 241 which is an alternative embodiment of the finstock 141 of FIG. 3. The finstock 241 is generally similar to the finstock 141, except for differences which are discussed below. In particular, the finstock 241 includes four parts 251-254, which are generally similar to the parts 151-154. The primary difference is that, in a top view, the parts 251-254 each have a shape which is approximately a right triangle, rather than a square. The 90° apexes of these triangular parts are all located at a common point which is disposed along the vertical axis 158. The other two corners of each part have a small rounded recess that provides clearance for a respective one of the four corner posts.

In operation, the finstock 241 splits and redirects the vertical air flow in portions that flow in four horizontal directions, in a manner similar to the finstock 141. Further, the finstock 241 has a low pressure drop, which is comparable to the low pressure drop of the finstock 141.

Figure 6:
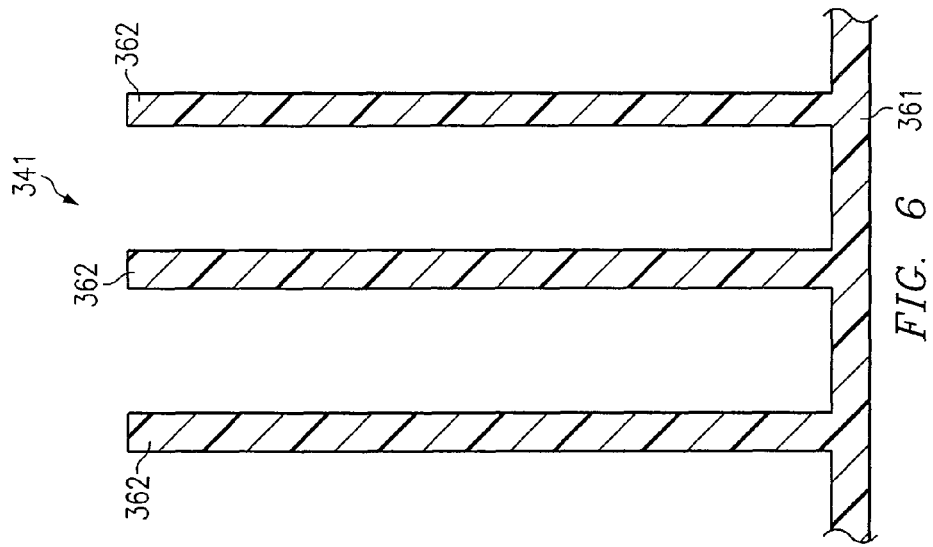
FIG. 6 is a diagrammatic fragmentary sectional side view similar to FIG. 4, but showing an alternative embodiment of the finstock of FIG. 4.

As described above with reference to FIGS. 3 and 4, the finstock 141 is fabricated as four separate parts 151-154, each of which is a bent sheet of aluminum. Similarly, the four parts 251-254 of the finstock 241 of FIG. 5 are each a bent sheet of aluminum. It would alternatively be possible, in place of the finstock 141 and finstock 241, to use a finstock which is made of some other material that conducts heat well. As one example, a single integral finstock could be made by injection molding techniques. In this regard, FIG. 6 is a diagrammatic fragmentary sectional side view of such an injection-molded finstock, which is identified by reference numeral 341.

The finstock 341 is injection-molded from a thermally conductive molding material, such as a material having a base polymer which is a thermally conductive liquid crystalline polymer (LCP) or a thermally conductive polyphenylene sulfide (PPS). For example, suitable base polymers are available commercially under the trademark COOLPOLY from Cool Polymers, Inc. of Warwick, R.I., including LCP product COOLPOLY E2, and PPS products COOLPOLY RB020 AND COOLPOLY RS012. The finstock 341 is a single injection molded part, rather than several separate sections as in the embodiments of FIGS. 1-5. It will be recognized that, as an alternative to injection molding, the finstock 341 could be formed by resin transfer molding.

As a further not-illustrated alternative, if the finstock is molded (for example as shown at 341), then the top plate 103 can optionally be omitted, and the plenum 116 can be directly secured to the tops of the fins of finstock 341, for example using a suitable known epoxy adhesive. In that case, it is possible to optionally omit the four support posts (three of which are visible at 106-108). As still another alternative, a molded finstock could be similar to that shown at 341 in FIG. 6, except that the top plate 103 could be fabricated as an integral part of the molded finstock 341, and the plenum 116 could be directly secured to the integral top plate.

FIG. 7 is a diagrammatic fragmentary perspective view similar to FIG. 2, but showing a cooling assembly 441 which is an alternative embodiment of the cooling assembly 41 of FIG. 2. The cooling assembly 441 is identical to the cooling assembly 41, except for the difference which is discussed below. More specifically, the finstock 141 of the assembly 41 has been omitted in the assembly 441, and an approximately rectangular block 444 of porous material is provided in its place. The block 444 extends vertically from the bottom plate 101 to the top plate 103, and is physically and thermally secured to the bottom plate 101 by welding, brazing or a thermally conductive epoxy, or in some other suitable manner.

The porous block 444 is made from a porous open-cell sintered material which is heat conductive, but it could alternatively be made from a porous open-cell foamed material which is heat conductive. In this disclosed embodiment, the sintered or foamed porous material used for the block 444 is aluminum, but it could alternatively be some other suitable heat-conductive material. The porous block 444 is relatively inexpensive. The downward air flow from the fan 121 enters the central portion of the porous block 444, and then flows horizontally outwardly through the block 444 in a variety of different radial directions.

As discussed above, the finstock 341 of FIG. 6 is an injection molded part of a synthetic material. As another alternative, the finstock could be made from some other heat-conductive material that is amenable to casting or molding, such as a die-cast zinc alloy. In this regard, FIG. 8 is a diagrammatic top view of a finstock 541 which is a die-cast part made of a zinc alloy, which is an alternative embodiment of the finstock 141 of FIGS. 2 and 3, and which can be substituted for the finstock 141 in the cooling assembly 41 of FIG. 2. The finstock 541 has horizontal dimensions of about 2 inches by 2 inches, with the base plate about 0.05 inch thick and the fins about 0.25 inch high. There are about 16 fins per inch, and the fins have rounded tips.

The fins increase in thickness from the tip to the base, with a thickness of about 0.01 inch near the tip and about 0.025 inch near the base. Between each adjacent pair of fins, the top surface of the base is slightly rounded, so as to be concave. The zinc alloy used for the finstock 541 is an alloy commonly known as zinc die-casting Alloy 3, which includes 3.5% to 4.3% aluminum, a maximum of 0.25% copper, 0.02% to 0.05% magnesium, a maximum of 0.1% iron, a maximum of 0.005% lead, a maximum of 0.004% cadmium, and a maximum of 0.003% tin, with the balance being zinc. Of course, these specific dimensions and specific alloy given above for the finstock 541 are exemplary, and it will be recognized that variations of the dimensions and the material are possible without departing from the scope of the present invention.

The present invention provides a number of technical advantages. One such technical advantage results from the use of a forced fluid flow which is split to flow through a thermally conductive section in a manner so that a plurality of flow portions exit the thermally conductive section at a plurality of respective locations disposed along a substantial portion of the periphery of the thermally conductive section. Splitting the fluid flow in this manner yields a low pressure drop, which facilitates low power consumption and minimal audible noise for the cooling assembly. A related advantage is realized when the thermally conductive section is a finstock that has a relatively low height but has a relatively large surface area that provides a high degree of convective heat transfer. A different advantage is realized when the thermally conductive section is a block of porous material with a relatively low height, in part because the porous material can be fabricated at a very low cost.

Another advantage is that the low profile of the cooling assembly facilitates its use in a portable computer, by permitting the housing of the computer to be relatively thin. Still another advantage is that, when used in a portable computer, the cooling assembly can effect cooling of the processor or some other circuit component, and then the air flow from the cooling assembly can be routed within the housing to facilitate cooling of still other heat-dissipating components. Through use of such techniques, a portable computer can be relatively thin and lightweight, and can have a processor which operates at its highest rated speed, while enjoying efficient cooling through use of a configuration that consumes minimal power.

Although selected embodiments have been illustrated and described in detail, it will be understood that various substitutions and alterations are possible without departing from the spirit and scope of the present invention, as defined by the following claims.

What is claimed is:

1. An apparatus comprising:
a thermally conductive section having a side which faces in a direction approximately parallel to an axis, and which is adapted to be thermally coupled to a circuit component; and
a fluid supply section disposed on a side of said thermally conductive section opposite from said side facing in said direction and operable to direct a fluid flow along said axis toward said thermally conductive section, said thermally conductive section causing said fluid flow to split into a plurality of flow portions which each flow through said thermally conductive section in a direction approximately parallel to a plane perpendicular to said axis, said flow portions exiting said thermally conductive section at a plurality of respective locations which are disposed along a substantial portion of the periphery of said thermally conductive section;
wherein said plurality of flow portions each flow away from said axis through said thermally conductive section in a respective one of at least three directions that each extend approximately radially of said axis; and
said thermally conductive section further having a plurality of fins which projects outwardly from said side of said thermally conductive section opposite from said side facing in said direction, said fins being arranged in at least three groups which are distributed angularly about said axis, the fins in each said group extending approximately parallel to each other, at least one said fin of each said group extending approximately radially of said axis.

2. An apparatus according to claim 1, wherein said fluid flow directed along said axis is a flow of air.

3. An apparatus according to claim 2, wherein said fluid supply section includes a fan that effects an air flow which is said fluid flow.

4. An apparatus according to claim 3, including a plenum disposed between said fan and said thermally conductive section, said air flow passing through said plenum.

5. An apparatus according to claim 1, wherein there are four said groups of fins, the fins of two of said groups extending approximately parallel to a first line which is perpendicular to said axis, and the fins of the other two of said groups extending approximately parallel to a second line which is perpendicular to each of said axis and said first line.

6. An apparatus according to claim 5, wherein each said group of fins, when viewed in a direction parallel to said axis, defines approximately a square having one corner disposed at said axis.

7. An apparatus according to claim 5, wherein each said group of fins, when viewed in a direction parallel to said axis, defines approximately a right triangle having the 90° apex disposed at said axis.

8. An apparatus according to claim 5, wherein each said fin of each said group has one end which terminates at an end of a respective said fin from a different said group.

9. An apparatus according to claim 1, wherein said thermally conductive section includes a thermally conductive sheet which is bent to have a plurality of pairs of side portions which are parallel and adjacent, a plurality of first end portions which each extend between the side portions of a respective said pair at one end thereof, and a plurality of second end portions which each extend between two said side portions from different said pairs at the other ends thereof, said second end portions each being substantially longer than each of said first end portions and each defining a respective part of said base portion, and each said first end portion and the associated pair of said side portions defining a respective said fin.

10. An apparatus according to claim 9, wherein said thermally conductive sheet is made of metal.

11. An apparatus according to claim 1, wherein said thermally conductive section is a molded part made of a thermally conductive molding material, and includes an approximately planar first portion which serves as a base and a plurality of approximately planar second portions which project outwardly from one side of said first portion and which serve as fins.

12. An apparatus according to claim 1, including a circuit which includes a circuit component having a surface thereon, said side of said thermally conductive section being mounted on said component in thermal communication with said surface of said component.

13. A method, comprising the steps of:
configuring a thermally conductive section to have a side which faces in direction approximately parallel to an axis and which is adapted to be thermally coupled to a circuit component; and
directing a fluid flow along said axis approximately in said first direction, said thermally conductive section causing said fluid flow to split into a plurality of flow portions which each flow through said thermally conductive section in a direction approximately parallel to a plane perpendicular to said axis, said flow portions exiting said thermally conductive section at a plurality of respective locations which are disposed along a substantial portion of the periphery of said thermally conductive section;

wherein said step of directing said fluid flow includes the step of causing said plurality of flow portions to each flow away from said axis through said thermally conductive section in a respective one of at least three directions that each extend approximately radially of said axis; and wherein said configuring step includes the step of configuring said thermally conductive section to include a plurality of fins which projects outwardly from said side of said thermally conductive section opposite from said side facing in said direction, said fins being arranged in at least three groups which are distributed angularly about said axis, the fins in each said group extending approximately parallel to each other, and at least one said fin of each said group extending approximately radially of said axis.

14. A method according to claim 13, including the step of selecting air as the fluid for said fluid flow.

15. A method according to claim 13, wherein said configuring step includes the step of providing four said groups of fins, the fins of two of said groups extending approximately parallel to a first line which is perpendicular to said axis, and the fins of the other two of said groups extending approximately parallel to a second line which is perpendicular to each of said axis and said first line.

16. A method according to claim 13, wherein said configuring step includes the step of bending a thermally conductive sheet to have a plurality of pairs of side portions which are parallel and adjacent, a plurality of first end portions which each extend between the side portions of a respective said pair at one end thereof, and a plurality of second end portions which each extend between two said side portions from different said pairs at the other ends thereof, said second end portions each being substantially longer than each of said first end portions and each defining a respective part of said base portion, and each said first end portion and the associated pair of said side portions defining a respective said fin.

17. A method according to claim 13, wherein said configuring step includes the step of molding from a thermally conductive molding material a part which includes an approximately planar first portion and a plurality of approximately planar second portions projecting outwardly from one side of said first portion, said first portion defining a part of said base portion and said second portions each defining a respective said fin.

18. A method according to claim 13, including the steps of:
providing a circuit which includes a circuit component having a surface thereon; and
mounting said side of said thermally conductive section on said component in thermal communication with said surface of said component.

* * * * *